(12) United States Patent  
Schluchter

(10) Patent No.: US 7,355,719 B2  
(45) Date of Patent: Apr. 8, 2008

(54) INTERFEROMETER FOR MEASURING PERPENDICULAR TRANSLATIONS

(75) Inventor: William Clay Schluchter, Los Altos, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 287 days.

(21) Appl. No.: 11/205,368

(22) Filed: Aug. 16, 2005

(65) Prior Publication Data

US 2007/0041022 A1  Feb. 22, 2007

(51) Int. Cl.  
*G01B 9/02* (2006.01)  
*G01B 11/02* (2006.01)

(52) U.S. Cl. .................. 356/493; 356/498; 356/500

(58) Field of Classification Search ................ 356/496, 356/498, 500, 486, 493, 508, 509  
See application file for complete search history.

(56) References Cited

U.S. PATENT DOCUMENTS

| | | | | | |
|---|---|---|---|---|---|
| 3,622,244 | A | * | 11/1971 | Chitayat | 356/500 |
| 4,589,746 | A | * | 5/1986 | Pavone | 396/548 |
| 5,825,456 | A | * | 10/1998 | Tabata et al. | 351/201 |
| 6,020,964 | A | * | 2/2000 | Loopstra et al. | 356/500 |
| 6,208,407 | B1 | * | 3/2001 | Loopstra | 355/53 |
| 6,285,444 | B1 | * | 9/2001 | Osanai et al. | 355/72 |
| 6,650,419 | B2 | * | 11/2003 | Hill | 356/500 |
| 6,762,845 | B2 | * | 7/2004 | Hill | 356/520 |
| 6,947,148 | B2 | * | 9/2005 | Hill | 356/493 |
| 7,130,056 | B2 | * | 10/2006 | Schluchter et al. | 356/500 |
| 7,158,236 | B2 | * | 1/2007 | Schluchter | 356/500 |
| 2003/0048456 | A1 | * | 3/2003 | Hill | 356/500 |
| 2005/0111005 | A1 | * | 5/2005 | Eussen et al. | 356/498 |

* cited by examiner

*Primary Examiner*—Hwa (Andrew) Lee  
*Assistant Examiner*—Scott M Richey

(57) ABSTRACT

An interferometer provides a large dynamic range for perpendicular displacement measurements. In operation, a measurement reflector on an object reflects a measurement beam to an overlying Porro prism, and a reference reflector on the object returns a reference beam to the interferometer. A second Porro prism in the interferometer can return the reference beam for a second pass to the reference reflector, while the measurement beam complete only one pass. Reductions in beam walk-off result from retroreflections in the Porro prisms and the matching effects that some object rotations have on measurement and reference beams. Perpendicular motion of the object relative to the first Porro prism causes a Doppler shift only in the measurement beam. Accordingly, a beat frequency found when combining the measurement and reference beams can indicate a residual Doppler shift associated with the motion in the perpendicular direction.

20 Claims, 2 Drawing Sheets

INTERFEROMETER FOR MEASURING PERPENDICULAR TRANSLATIONS

BACKGROUND

A plane mirror interferometer can be used to measure the position, orientation, or movement of a precision stage in a wafer processing system. For such use, a plane mirror is typically mounted on the stage being measured, and the interferometer directs one or more measurement beams for reflections from the plane mirror. Each measurement beam generally corresponds to a separate interferometer channel, but some interferometers commonly referred to as double-pass interferometers direct each measurement beam for two reflections from the plane mirror before the interferometer combines the measurement beam with a reference beam for signal processing that produces measurements.

Multiple interferometer channels can use the same plane mirror to measure distances to separated points on a plane and thereby measure multiple degrees of freedom of a stage. In particular, the three interferometer channels measuring translations at three separate points on the same plane mirror can identify a translation of the stage along an X or beam axis, a pitch rotation of the stage about a Y axis perpendicular to the X axis, and a yaw rotation of the stage about a Z axis perpendicular to X and Y axes. Stage rotations are important to measure when the system is susceptible to Abbe errors, i.e., displacement errors due to stage rotations.

A dynamic measurement range for each channel of a plane mirror interferometer is generally limited because mirror rotations (e.g., pitch rotation) can deflect the measurement beam, causing the reflected measurement beam to "walk off" the path required for recombination with a reference beam. For some configurations, the dynamic range for measurements is roughly equal to the measurement beam radius w divided by optical path length for the measurement beam, e.g., about four times the distance L extending from the interferometer to the plane mirror in a double pass interferometer. Accordingly, the dynamic range for rotation measurements is typically limited to about w/4L radians. Increasing the beam width w can increase the dynamic measurement range. However, larger beam widths generally require larger and therefore more expensive optics, and complex systems such as wafer processing equipment may not have sufficient space for large interferometers.

A separate plane mirror interferometer can also be used to measure the position or movement of a stage along a Z axis (i.e., the focus axis of the projection lens.) However, if this interferometer is on the projection lens side of the stage, the stage must be made larger for inclusion of a plane mirror outside the projection area. This can reduce wafer throughput. Alternatively, if the interferometer is on a side opposite to the projection lens, an intermediate reference such as a stone below the stage is generally needed, which requires additional measurements of the relative position of the intermediate reference relative to the projection lens.

U.S. Pat. Nos. 6,020,964 and 6,650,419 describes interferometer systems capable of measuring an altitude of a stage. In such systems, a reflector mounted on a stage reflects a measurement beam from a horizontal incident path (along an X axis) to a vertical reflected path (along a Z axis). A reflector mounted above the stage reflects the vertically directed measurement beam back to the reflector system on the stage, where the measurement beam is redirected to a horizontal return path back to the interferometer optics. The total phase change or Doppler shift of measurement beam thus indicates a distance or movement along a path having horizontal and vertical components. A separate interferometer channel can measure the horizontal component of the path, so that the vertical component or an altitude measurement can be extracted. These altitude measurements are generally subject to the above-described dynamic range limitations at least because of the need to measure and subtract the horizontal component.

In view of the limitations of existing interferometers, systems and methods are sought that can provide a large dynamic measurement range for measurements of altitudes or vertical translations without requiring large optical elements.

SUMMARY

In one embodiment in accordance with the present teachings, an interferometer provides a large dynamic range for measuring displacements of an object that are perpendicular to the separation between the interferometer and the object. The interferometer uses a reference reflector and a measurement reflector on the object being measured. The measurement reflector reflects a measurement beam to a Porro prism mounted above the object, and the reference reflector directly returns the reference beam to the interferometer. A second Porro prism in the interferometer can return the reference beam for a second pass and reflection from the reference reflector. The Porro prisms can reduce beam walk-off resulting when the stage rotates. Other effects of stage rotations that the Porro prisms do not ameliorate are similar for the measurement and reference beams so that walk off is small. Accordingly, a large dynamic range can be achieved without requiring large beam diameters.

One exemplary embodiment of an interferometer system is for measuring an object such as a wafer stage on which a measurement reflector and a reference reflector are mounted. This interferometer system includes optics that direct a measurement beam and a reference beam in an X direction respectively to the measurement reflector and the reference reflector. The measurement reflector redirects the measurement beam to a Z direction, and the reference reflector directs the reference beam back to the interferometer optics. A reflector such as a Porro prism overlies the object and is positioned to direct the measurement beam back to the measurement reflector, which then redirects the measurement beam back to the interferometer optics. The interferometer then redirects the reference beam for a second pass to the reference reflector, which reflects the beam back to the interferometer. The interferometer optics combine the measurement and the reference beams, and a detector converts the combined beam into an electric signal from which a measurement of a relative displacement of the object in the Z direction is determined.

Another exemplary embodiment in accordance with the present teachings is an interferometer system that includes a polarizing beam splitter, a measurement reflector, a first Porro prism, a reference reflector, and a detector. The polarizing beam splitter splits an input beam into a measurement beam and a reference beam. The measurement reflector receives the measurement beam from the polarizing beam splitter and reflects the measurement beam from a first path to a second path. The first Porro prism receives the measurement beam and returns the measurement beam to the measurement reflector along a third path that is offset from the second path. The second and third paths are generally perpendicular to the first path. The reference reflector is fixed relative to the measurement reflector and located so that the reference reflector receives the reference beam from the polarizing beam splitter and reflects the reference beam back to the polarizing beam splitter. The polarizing beam splitter recombines the measurement beam and the reference beam, and a detector converts the resulting recombined beam into an electric signal from which a measurement of a displacement is determined.

A return reflector such as a second Porro prism can be positioned to receive the reference beam from the polarizing beam splitter after the reference beam has reflected from the reference reflector during a first pass. The return reflector directs the reference beam back to the PBS for a second reflection from the reference reflector, after which the polarizing beam splitter recombines the measurement and reference beams.

Yet another embodiment of in accordance with the present teachings is a method for measuring displacement that is perpendicular to a separation between an interferometer and an object being measured. The method begins with directing a measurement beam for a reflection from a first reflector that is mounted on the object, wherein the first reflector directs the measurement beam in a first direction perpendicular to the separation between the interferometer and the object. A second reflector such as a Porro prism that is separated from the first reflector along the first direction reflects the measurement beam back to the first reflector. The method further includes directing a reference beam for two reflections from a third mirror that is mounted on the object and combining the measurement beam and the reference beam to form a combined beam. Measuring a beat frequency of the combined beam indicates a residual Doppler shift of the measurement or reference beam that is not canceled by a matching Doppler shift of the other beam. The residual Doppler shift depends on movement perpendicular to the separation between the interferometer and the object.

BRIEF DESCRIPTION OF THE DRAWINGS

Use of the same reference symbols in different figures indicates similar or identical items.

DETAILED DESCRIPTION

In accordance with an aspect of the present teachings, an interferometer capable of measuring a vertical displacement of an object horizontally spaced from the interferometer can employ measurement and reference reflectors on the object being measured, a first Porro prism above the object being measured, and a second Porro prism in the interferometer optics. A polarizing beam splitter in the interferometer splits an input beam into a measurement beam and a reference beam that are both directed at the object.

The measurement beam travels horizontally to the measurement reflector, vertically to the first Porro prism, vertically back to the measurement reflector, and horizontally back to the interferometer optics, where the measurement beam can be recombined with the reference beam and measured. Accordingly, the measurement beam reflects twice from the measurement reflector during a single pass from interferometer optics and back.

The reference beam travels from the interferometer to the reference reflector and directly returns to the interferometer optics during a first pass. The reference beam then reflects from the second Porro prism and travels from the interferometer to the reference reflector and directly returns to the interferometer optics during a second pass. The reference beams after completing a second pass from the interferometer optics to the object can be recombined with the measurement beam, which only makes one pass from the interferometer optics to the object and back.

The interferometer system achieves very low walk-off between the measurement and reference beams when recombined. The low walk-off results because both the measurement beam and the reference beam reflect twice from reflectors on the object so that the pitch rotations of the object cause matching angular deflections of the measurement and reference beams. Additionally, the Porro prisms provide retroreflections in appropriate planes to cancel at least some of the effects of yaw and roll rotations of the object.

Figure 1:
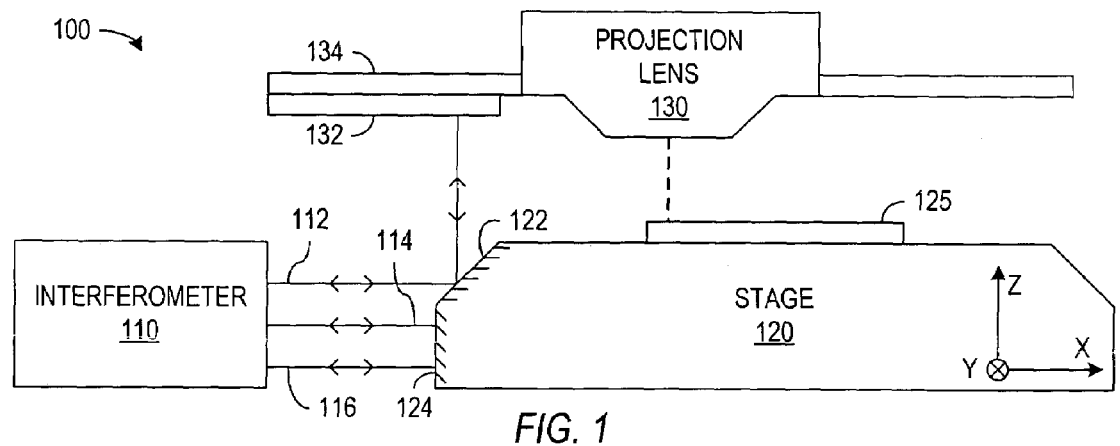
FIG. 1 shows a wafer processing system including interferometer capable of measuring an altitude of a precision stage relative to a projection lens.

FIG. 1 illustrates a system 100 including an interferometer 110 capable of measuring the vertical translation of an object. In the illustrated embodiment, system 100 is part of photolithography equipment suitable for processing semiconductor wafers, and the object measured is a stage 120 for positioning of a semiconductor wafer 125 relative to a projection lens 130 during a photolithographic process. For such processes, stage 120 and/or a positioning system (not shown) for projection lens 130 must be able to accurately position wafer 125 relative to an optical axis of projection lens 130 so that projection lens 130 can project the desired pattern onto the correct area of wafer 125. Further, stage 120 or a focusing system for projection lens 130 must be able to control or adapt to the separation between wafer 125 and projection lens 130 in order to form a sharply focused pattern. Interferometer 110 measures a relative altitude or Z displacement of stage 120, where the Z direction is substantially perpendicular to the separation between interferometer 110 and stage 120. An operator or a control system (not shown) can use the altitude measurement when controlling stage 120 and/or the focusing system for projection lens 130. As will be understood by those of skill in the art, measurement of the altitude of stage 120 relative to projection lens 130 in wafer processing equipment 100 is merely an illustrative application of interferometer 110, and more generally, interferometer 110 can measure a variety of objects in a variety of systems.

For an altitude measurement, interferometer 110 directs a measurement beam 112 and a reference beam 114 at respective planar reflectors 122 and 124 on stage 120. Additionally, a second measurement beam 116 can be directed to planar reflector 124 for a conventional measurement of displacement of the object along the X direction.

Planar reflector 122 in an exemplary embodiment is a plane mirror oriented at 45° to horizontal and reflects measurement beam 112 from a horizontal path to a vertical path. The vertical path takes measurement beam 112 to a reflector 132 on a mounting structure 134 that may be fixed to projection lens 130. Reflector 132 in an exemplary embodiment is an extruded Porro prism having a length along the X direction and oriented and positioned to reflect measurement beam 112 back to reflector 122 for any position of stage 120 in its movement range. Reflector 122 then directs measurement beam 112 back to interferometer 110. Planar reflector 124 reflects reference beam 114 directly back to interferometer 110, so that the path of reference beam 114 to and from stage 120 is nominally horizontal.

In an exemplary embodiment, interferometer 110 is a Michelson interferometer in which each of measurement beam 112 and reference beam 114 reflects twice from respective reflectors 122 and 124 before being recombined for analysis. The two reflections of the measurement beam from stage 120 occur during a single pass from interferometer 110 to Porro prism 132 and back. The two reflections of the reference beam from stage 120 occur during two separate passes from interferometer 110 to stage 120.

Figure 2A:
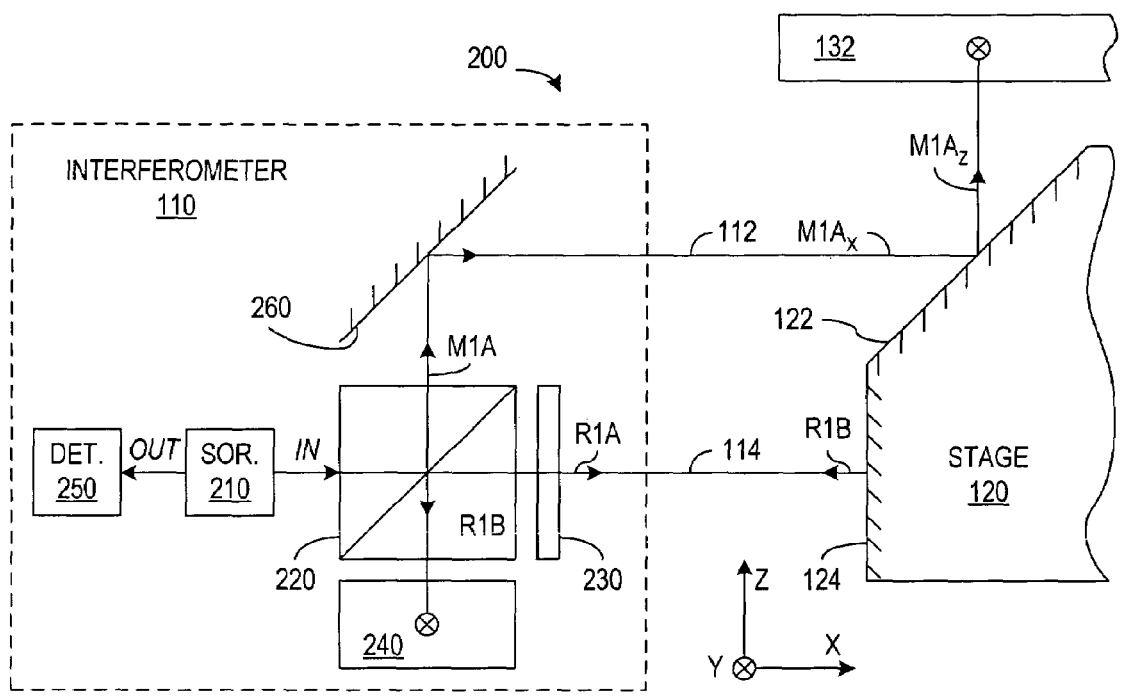
FIGS. 2A, 2B, and 2C respectively show side, top, and front views of beam paths in an interferometer suitable for the system of FIG. 1.
Figure 2B:
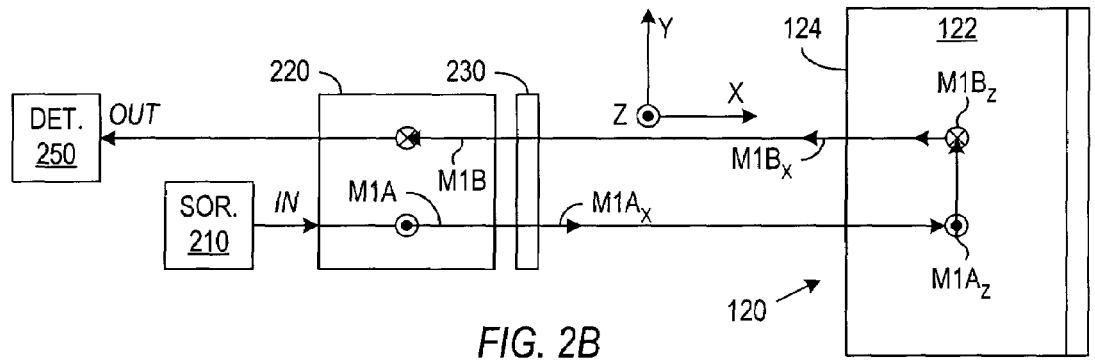
Figure 2C:
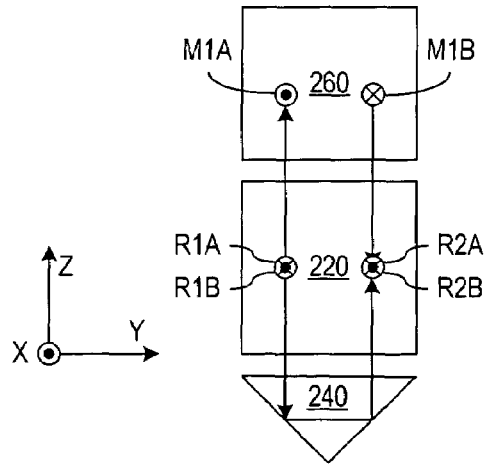

An embodiment of interferometer 110 shown in FIGS. 2A, 2B, and 2C includes a beam source 210, a polarizing beam splitter (PBS) 220, a quarter-wave plate (QWP) 230, a Porro prism 240, a detector system 250, and a turning mirror 260. Beam source 210 is a source of an input beam IN from which PBS 220 extracts measurement beam 112 and reference beam 114. In one embodiment of interferometer 110, beam IN is a heterodyne beam having a first component with a first frequency F1 and a first linear polarization and a second component having a second frequency F2 and a second linear polarization that is perpendicular to the first linear polarization. Many beam sources are capable of producing a heterodyne beam having the desired properties. Beam source 210 may, for example, be a laser that produces the desired difference in frequencies F1 and F2 through Zeeman splitting and/or with an acousto-optic modulator (AOM). Other sources of heterodyne beams that are known or may be developed may also be suitable. Alternatively, beam source 210 could be a long coherence length single-frequency laser where the required coherence length depends on the difference between the optical path lengths of measurement beam 112 and reference beam 114. Use of a heterodyne beam may be preferred because interferometers using a single frequency beam typically require multiple phase measurements to eliminate the effects of beam power fluctuations.

PBS 220 separates the polarization components of input beam IN, so that measurement beam 112 and reference beam 114 have orthogonal linear polarizations. When input beam IN is a heterodyne beam, the orientation of the polarization axes of input beam IN and PBS 220 are such that the polarization separation separates the frequency components of input beam IN. Measurement beams 112 and reference beam 114 are thus single-frequency beams having orthogonal polarizations. In the embodiment illustrated in FIG. 2A, PBS 220 is such that measurement beam 112 has the linear polarization that a thin film in PBS 220 reflects, and reference beam 114 initially has a linear polarization that PBS 220 transmits. As will be understood by those of skill in the art, alternative embodiments of interferometer 110 could use the beam initially transmitted in PBS 220 as the measurement beam and use the beam initially reflected in PBS 220 as the reference beam. Additionally, although FIG. 2A illustrates an embodiment in which PBS 220 is implemented using a thin polarizing film that is sandwiched between right angle prisms, PBS 220 could be implemented using different structures such as birefringent optical elements that perform the beam splitting and combining functions required of PBS 220.

QWP 230 is in an optical path of reference beam 114 from PBS 220 to stage 120. QWP 230, which can be glued to PBS 220 or otherwise mounted in at fixed positions in the optical path of beam 114, changes the polarization of traversing beams. For example, a beam with horizontal polarization traversing QWP 230 becomes circularly polarized, and a traversing beam with a vertical linear polarization becomes circularly polarized with an orthogonal circular polarization.

Reference beam 114 follows an initial outward path R1A from PBS 220 through QWP 230, reflects from planar reflector 124 on stage 120, and returns to PBS 220 along a return path R1B through QWP 230. The paths R1A and R1B are collinear when reflector 124 is perpendicular to the X-axis as shown in FIG. 2A but will not be collinear if stage 120 has a non-zero pitch or yaw angle. Traversing QWP 230 twice during the first pass (i.e., on paths R1A and R1B) changes the polarization of reference beam 114 to the linear polarization that PBS 220 reflects. PBS 220 thus directs the returned reference beam 114 to Porro prism 240.

Porro prism 240 is oriented to retroreflect beams in a YZ plane and reflects reference beam 114 from path R1B to a path R2A that is offset in the Y direction from the incident path R1A. The offset in the Y direction between paths R1B and R2A causes the reference beam 114 to reflect from PBS 220 at a point off set into the page in FIG. 2A or toward the top of the page in FIG. 2B. FIG. 2C shows the offset in the Y direction of the outward path R2A of reference beam 114 during the second pass relative to the outward path R1A of reference beam 114 during the first pass.

Reference beam 114 on optical path R2A passes through QWP 230 and reflects a second time from reflector 124. Reference beam 114 then returns along a return path R2B through QWP 230 to PBS 220. The second pair of two passes through QWP 230 change the polarization of reference beam 114 back to the linear polarization that PBS 220 transmits, so that after the second pass, reference beam 114 passes through PBS 220 and becomes part of a recombined beam OUT that detector system 250 analyzes.

Measurement beam 112 after being initially reflected in PBS 220 traverses an outward path M1A to Porro prism 132. Outward path M1A includes a reflection from turning mirror 260 to a nominally horizontal path $M1A_X$ to planar reflector 122 on stage 120. The reflection from reflector 122 directs the measurement beam 112 to a nominally vertical path $M1A_z$ to Porro prism 132.

Porro prism 132 is oriented to retroreflect beams that are in the YZ plane and directs measurement beam 112 to a nominally vertical return path M1B.sub.z that is parallel (or antiparallel) to and offset in Y direction from vertical path M1A.sub.z. (Several of the paths of measurement beam 112 including vertical path M1B.sub.z are displace along the Y axis and are behind beam paths shown in the side view of FIG. 2A. FIGS. 2B and 2C respectively show top and front views in which some paths not shown in FIG. 2A are visible.) A complete return path M1B of measurement beam 112 includes vertical return path M1B.sub.z, reflection from reflector 122 on stage 120, a horizontal return path M1B.sub.x to turning mirror 260, and a reflection from turning mirror 260 before measurement beam 112 reenters PBS 220.

The positioning of Porro prisms 132 and 240 are such that Porro prism 132 offsets measurement beam 112 in the Y direction by the same distance that Porro prism 240 offsets reference beam 114. PBS 220 can thus combine returning measurement beam 112 with reference beam 114 after the second pass of reference beam 114 to form an output beam OUT.

A detector 250 measures output beam OUT for analysis that determine a vertical displacement of stage 120 relative to Porro prism 132. In an exemplary embodiment, detector 250 measures output beam OUT to determine a residual Doppler shift, and the residual Doppler shift can then be used to determine the vertical velocity or displacement of stage 120. In a heterodyne interferometer where measurement beam 112 and reference beam 114 initially have frequencies F1 and F2, the returned reference and measurement beams 112 and 114 will have frequencies F1' and F2' that depend on Doppler shifts that may have occurred as result of reflections from stage 120 or Porro prism 132 when stage 120 and/or Porro prism 132 are moving. A photodiode in detector system 250 receives output beam OUT and produce an electronic signal having the beat frequency F1'-F2'. Similarly, a reference electronic signal having the beat frequency F1-F2 can be produced through direct measurement of a portion of input beam IN.

An exemplary embodiment of detector system 250 further includes a phase detection circuit that measures the phase of the beat signal having frequency F1'-F2' relative to the reference beat signal having frequency F1-F2. A change in the relative phase indicates that beat frequencies F1'-F2' and F1-F2 differ and permits measurement of a residual Doppler shift in the measurement beam 112. For interferometer 110, movement of stage 120 in the X direction causes a Doppler shift in reference beam 114 that is twice the Doppler shift in measurement beams 112. Movement of stage 120 or Porro prism 132 in the Z direction causes a Doppler shift in the frequency of measurement beam 112 without causing a Doppler shift in the frequency of reference beam 114. Accordingly, the residual Doppler shift in beat frequencies F1'-F2' is a difference between the Doppler shift caused by movement along the Z axis and the Doppler shift caused by movement along the X axis. Measurement of the phase difference between the electronic beat signals having frequencies F1'-F2' and F1-F2 indicates the velocity along a direction at 45° to the X and Z directions, and integration of the determined velocity component indicates displacements along the same direction. The displacement along the Z direction can be found from this measurement of displacement along the direction at 45° to the X and Z and a separate conventional measurement of displacement along the X direction.

Measurements with interferometer 110 can provide a large dynamic range because retroreflections by Porro prisms 132 and 240 minimize the walk-off of measurement beam 112 relative to reference beam 114 when stage 120 rotates. For a roll rotation of stage 120 about the X axis, retroreflection by Porro prism 132 compensates for the resulting variation of vertical paths (e.g., path M1A.sub.z) from the Z direction by returning the measurement beam along a reflected path that is parallel to the incident path. Retroreflections in Porro prism 240 similarly reduces movement of reference beam 114 relative to measurement beam 112. For pitch of stage 120, measurement beam 112 and reference beam 114 both receive angular deflections in the ZX plane as a result of two reflections from stage 120, and therefore experience deflections that depend on the difference in the optical path lengths of measurement beam 112 and reference beam 114. The walk off between beams 112 and 114 is thus improved when compared to systems where the walk off depend on the full path length. For yaw rotations of stage 120, deflections of measurement beam 112 and reference beam 114 are also similar, so that walk off is small.

Figure 3:
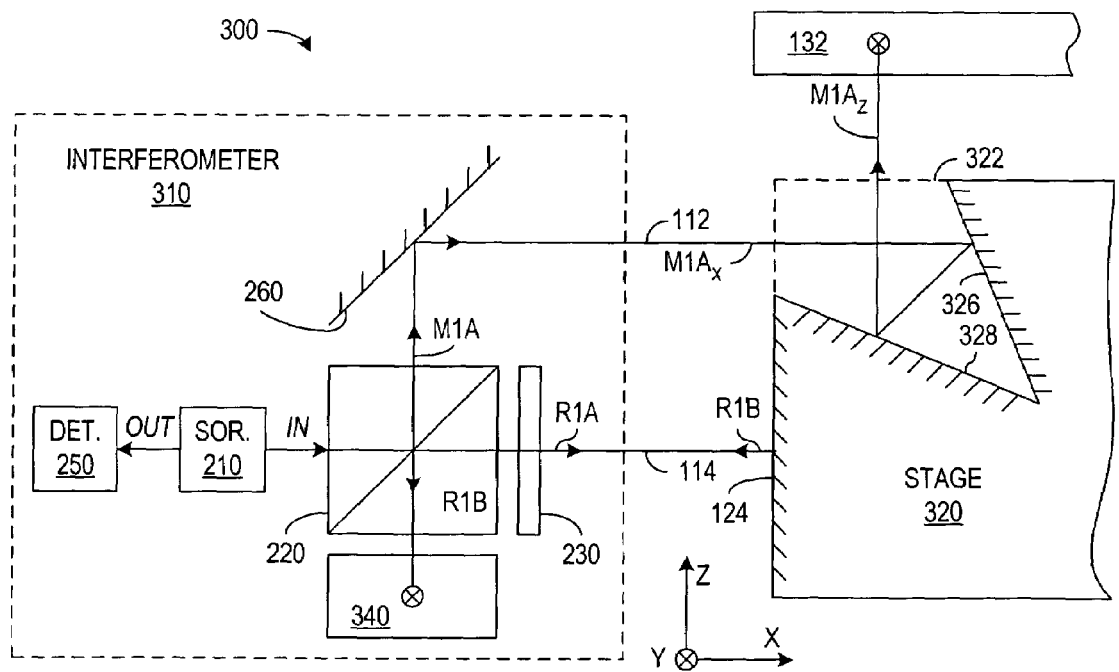
FIG. 3 illustrates an interferometer system in accordance with an embodiment employing a hollow penta prism as a measurement reflector.

FIG. 3 shows a system 300 in accordance with an alternative embodiment for measuring vertical displacements. System 300 differs from system 200 of FIG. 2A through use of a stage 320 including a measurement reflector 322 with two reflective surfaces 326 and 328. Reflective surface 326 is at an angle of 112.5° with the X-axis, and reflective surface 328 is at an angle of 157.5° with the X-axis. As a result, measurement reflector 322 acts as a hollow penta prism, and the pitch angle of stage 320 does not introduce an angular deflection of measurement beam 112. System 300 also differs from system 200 of FIG. 2A in that interferometer 310 can use a retroreflector 340, such as a cube corner or cat's eye, that returns the reference beam to stage 320 through reflection at PBS 220. As a result, stage rotations about the Y-axis or Z-axis will not introduce an angular deflections in the reference beam 114 after the second reflection from the stage. Thus the recombined beam OUT will again consist of two substantially colinear component beams. Otherwise, system 300 contains elements that operate substantially as described above in regard to FIGS. 2A, 2B, and 2C.

Although the invention is described with reference to particular embodiments, the description is only an example of the invention's application and should not be taken as a limitation. Various adaptations and combinations of features of the embodiments disclosed are within the scope of the invention as defined by the following claims.

What is claimed is:

1. A system for measuring an object, the system comprising:
   a measurement reflector mounted on the object and oriented to redirect a measurement beam traveling in an X direction to traveling in a Z direction;
   a reference reflector mounted on the object and oriented to redirect a reference beam traveling in the X direction back in an opposite direction;
   an optical system that directs the measurement beam in the X direction for a single pass to the measurement reflector and directs the reference beam in the X direction for a first pass to the reference reflector and then for a second pass to the reference reflector;
   an overlying reflector that overlies the object and is positioned to direct the measurement beam back to the measurement reflector which then redirects the measurement beam back to the optical system; and
   a detector that measures a difference in the measurement beam and the reference beam after the reference beam has completed the second pass and the measurement beam has complete only the single pass, wherein the difference indicates a relative displacement of the object in the Z direction.

2. The system of claim 1, wherein the optical system comprises:
   a polarizing beam splitter positioned to split an input beam to form the measurement beam and the reference beam;
   a turning mirror that turns one of the measurement beam and the reference beam to the X direction;
   a quarter-wave plate in a path of the reference beam; and
   a retroreflector positioned to receive the measurement beam and the reference beam from the polarizing beam splitter after respective reflections from the overlying reflector and the reference reflector, wherein the retroreflector directs the reference beam to a path back through the polarizing beam splitter the second pass to the reference reflector.

3. The system of claim 2, wherein the overlying reflector comprises a first Porro prism.

4. The system of claim 3, wherein the first Porro prism is oriented to retroreflect beams that are in a YZ plane.

5. The system of claim 3, wherein the retroreflector comprises a second Porro prism.

6. The system of claim 5, wherein the second Porro prism is oriented to retroreflect beams that are in a YZ plane.

7. The system of claim 2, wherein the retroreflector is selected from a group consisting of a cube corner and a cat's eye.

8. The system of claim 7, wherein the measurement reflector comprises a penta prism.

9. The system of claim 1, wherein the overlying reflector comprises a first Porro prism.

10. The system of claim 9, wherein the first Porro prism is oriented to retroreflect beams that are in a YZ plane.

11. The system of claim 1, wherein the detector comprises a photodiode and a phase detector.

12. The system of claim 1, wherein each of the measurement reflector and the reference reflector comprises a plane mirror.

13. An interferometer system comprising:
- a polarizing beam splitter positioned to split an input beam into a measurement beam and a reference beam;
- a measurement reflector positioned to reflect the measurement beam from a first measurement path to a second measurement path that is along a direction for which a displacement is measured;
- a first Porro prism along the second measurement path, wherein the first Porro prism returns the measurement beam to the measurement reflector along a third measurement path that is offset from the second measurement path;
- a reference reflector that is fixed relative to the measurement reflector, wherein the reference reflector receives the reference beam from the polarizing beam splitter and reflects the reference beam back to the polarizing beam splitter; and
- a detector that measures a difference between the measurement beam and the reference beam, wherein the difference indicates the displacement.

14. The system of claim 13, further comprising a return reflector positioned to receive the reference beam from the polarizing beam splitter after the reference beam has reflected from the reference reflector during a first pass, wherein the return reflector directs the reference beam back to the polarizing beam splitter for a second pass to the reference reflector, after which the detector measures the difference between the reference beam and the measurement beam that has only completed a single pass from the polarizing beam splitter.

15. The system of claim 14, wherein the return reflector comprises a second Porro prism.

16. The system of claim 15, wherein a vertex of the first Porro prism is parallel to a vertex of the second Porro prism.

17. A method for measuring a displacement that is perpendicular to a separation between an interferometer and an object being measured, the method comprising:
(a) directing a measurement beam for a reflection from a first reflector that is mounted on the object, wherein the first reflector directs the measurement beam on a first path that is in a first direction perpendicular to the separation between the interferometer and the object;
(b) reflecting the measurement beam back to the first reflector on a second path that is parallel to and offset from the first path using a second reflector that is separated from the first reflector along the first direction without any intervening reflectors between the first and second reflectors;
(c) directing a reference beam for reflection from a third reflector that is mounted on the object; and
(d) measuring a difference between the reference beam and the measurement beam that indicates the displacement.

18. The method of claim 17, wherein measuring the difference comprises:
combining the measurement beam and the reference beam to form a combined beam; and
measuring a beat frequency of the combined beam to identify a residual Doppler shift of the measurement beam, the residual Doppler shift indicating the displacement that is perpendicular to the separation between the interferometer and the object.

19. The method of claim 17, wherein the second reflector comprises a Porro prism.

20. The method of claim 17, further comprising directing the reference beam for reflection from the third reflector a second time before executing step (d).

* * * * *